United States Patent [19]
Setty et al.

[11] Patent Number: 5,877,720
[45] Date of Patent: Mar. 2, 1999

[54] RECONFIGURABLE ANALOG-TO-DIGITAL CONVERTER

[75] Inventors: Palaksha Setty, Sunnyvale, Calif.; Jeff Sonntag, Allentown, Pa.

[73] Assignee: Lucent Technologies, Inc., Murray Hill, N.J.

[21] Appl. No.: 866,194

[22] Filed: May 30, 1997

[51] Int. Cl.[6] .................................................. H03M 1/10
[52] U.S. Cl. .......................................... 341/159; 341/120
[58] Field of Search .................................... 341/159, 120, 341/118, 161; 344/615

[56] References Cited

U.S. PATENT DOCUMENTS 5,327,129  7/1994  Soenen et al. ........................... 341/120

*Primary Examiner*—Brian Young
*Attorney, Agent, or Firm*—Synnestvedt & Lechner

[57] ABSTRACT

A reconfigurable analog-to-digital (A/D) converter that produces an N bit output in a first operating mode and an (N+1) bit output in a second operating mode. The reconfigurable A/D converter is especially well-suited for use in a read channel device.

31 Claims, 6 Drawing Sheets

| IF THE INPUT IS IN SEGMENT I | | IF THE INPUT IS IN SEGMENT II | |
|---|---|---|---|
| COMPARATOR 19 OUTPUTS | INTERPOLATING LATCHES 13 OUTPUT | COMPARATOR 19 OUTPUTS | INTERPOLATING LATCHES 13 OUTPUT |
| 0 | 0 | 0 | 0 |
| 0 | 0 | 0 | 0 |
| 0 | 0 | 0 | 0 |
| 0 | 0 | 0 | 1 |
| 1 | 1 | 1 | 1 |
| 1 | 1 | 1 | 1 |
| 1 | 1 | 1 | 1 |
| 1 | 1 | 1 | 1 |
| 1 | 1 | 1 | 1 |

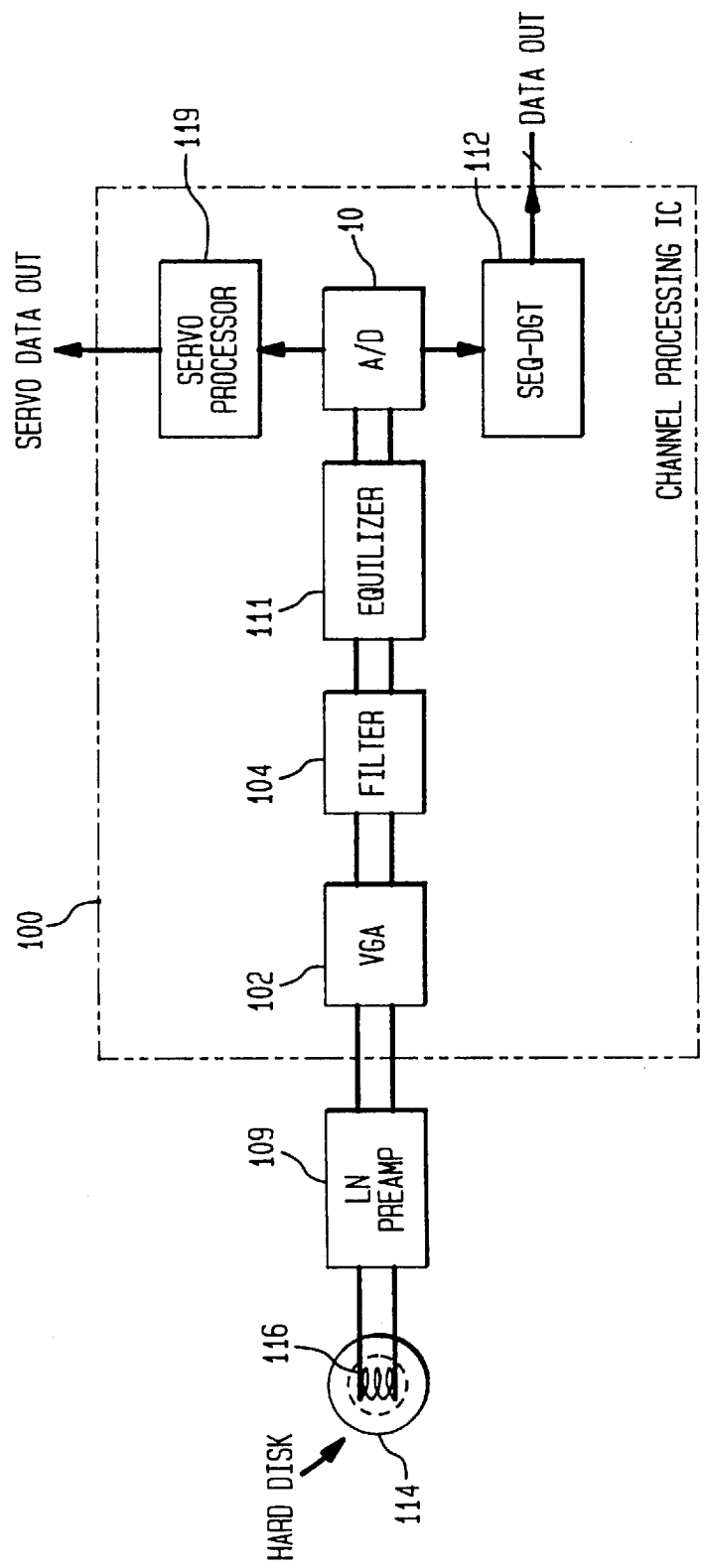

RECONFIGURABLE ANALOG-TO-DIGITAL CONVERTER

FIELD OF THE INVENTION

The present invention relates generally to an analog-to-digital (A/D)converter, and more particularly to an A/D converter that is selectively switchable (or "reconfigurable") between two resolution levels. A reconfigurable A/D converter of this type is particularly beneficial in a front-end signal-processing Integrated Circuit (IC), sometimes referred to as a Read Channel IC, that is used for reading data and servo signals from a computer hard-disk drive.

BACKGROUND OF THE INVENTION

DESCRIPTION OF THE PRIOR ART

A/D converters, in general, operate according to a particular set of specifications. The most important of these are the resolution (number of bits) and the sampling frequency. For example, an 8 bit, 400 MHz A/D converter has a resolution of 8 bits and can produce 400 Million digital outputs in one second. Flash architecture is one well known method of implementing a high speed A/D converter. An example of flash architecture is disclosed in an article entitled "A 400 MHz input flash converter with error correction", *IEEE Journal of Solid State Circuits*, Vol. 25, No. 1, pp. 184–191, Feb. 1990 (C. Mangelsdorf). Flash architecture requires $2^N$ comparators for N bit resolution. Thus, a major drawback of flash architecture is that the size of the converter essentially doubles if the resolution is increased by one bit. As a consequence the power dissipation also roughly doubles, making it almost impractical to use this architecture for more than 10-bits of resolution.

To address the above-mentioned problem attempts have been made to modify basic flash architecture. One such modification is sub-ranging, two-stage, A/D converter architecture as taught by A. G. F. Dingwall and V. Zazzu in "An 8 MHz CMOS Subranging 8-bit A/D Converter", *IEEE Journal of Solid State Circuits*, Vol. SC-20, No. 6, pp. 1138–1143, 1985. In this architecture, the final A/D converter resolution is obtained by a two step process in which two sequential "passes" are made through a low-resolution flash A/D converter. Although this architecture consumes less space than a standard flash A/D converter (a one-step A/D converter), it suffers from reduced speed since two passes, one after the other, are required to obtain the final conversion. Each of the two stages has the same resolution, and the final A/D output is derived by cascading the outputs of the two stages. For example, if the first stage has 4-bit resolution the second stage will also have 4-bit resolution, with the final word being given by concatenation of the two words in the same order. Conceptually one could use this as a reconfigurable A/D converter by using only the first four bits in certain situations and all eight bits in other situations, but it would be very inefficient because the second pass would still need to be made, even though the information from the pass would be unused.

Many practical variations of this two-stage architecture exist. For example, the operation of the two stages can be pipelined so that the speed of conversion is the same as the conversion time of one stage, and the number of stages can be extended to be more than two. Such multi-step A/D converters are called pipelined multi-step A/D converters, an example of which is shown in an article entitled "A Pipelined 5 MHz Sample/9-bit Analog-to-Digital Converter", *IEEE Journal of Solid State Circuits,* Vol. SC-22, No. 6, pp. 954–961, Dec. 1987 (Stephen H. Levis and Paul R. Gray). Although the conversion rate is improved in these converters because of the pipelining, there is latency through the A/D converter that is equal to the sum of the delay through all of the stages. Such delay is unacceptable in many applications such as, for example, where the A/D converter is used in a feedback loop (such as in a read channel IC). All of the above-described architectures are attempts to reduce basic problems inherent in flash architecture. However, the concept of reconfigurability of these, and other, types of A/D converters is not addressed by these architectures.

Another well known solution is an interpolating A/D converter as taught by J. Van Valbourg and R. J. Van de Plassche in "An 8b 650 MHz Folding ADC", *IEEE Journal of Solid-State Circuits*, Vol. SC-27, No. 12, pp. 1662–1666, Dec. 1992. Although this architecture results in a smaller size than a flash A/D converter with comparable speed and resolution, there is no way known to the Applicant herein to reconfigure an interpolating A/D converter to obtain a different resolution (number of bits) or a different speed.

Another solution is the use of a parallel A/D convertor using $2^{(n-1)}$ comparators as taught by U.S. Pat. No. 4,928,103. As with prior solutions, while there is a smaller-sized A/D converter produced, there has been heretofore no way known to the Applicant to reconfigure such a convertor to obtain a different resolution or a different speed.

One application in which it would be desirable to be able to switch between a low resolution, high speed A/D convertor and a high resolution, low speed A/D convertor is in a magnetic mass storage device. Magnetic mass storage devices, such as disk drives, are used to store large amounts of data, especially in computer systems. Disk drives include a plurality of magnetized disks and a spindle motor to rotate the disks. Data is stored on concentric data tracks on the surfaces of the magnetized rotating disks. A sensor (usually referred to as a read/write head) positioned proximate the rotating disk and moveable in a radial direction is used to detect (i.e., read) information, in the form of analog signals, from the disks. An important aspect of the operation of the disk drive is the positioning or location of the read/write head with respect to the magnetized tracks on the rotating disk. A servo mechanism is used to determine and control the exact position of the read/write head with respect to the disk, so that data can be read from or written onto a specific sector and track on a specific disk.

Generally, two types of data or information are stored on the disk drive. The first type is user data and this data is read during a user mode. The second type is servo data which is the data used by the servo mechanism to determine the position of the read/write head with respect to a specific sector on a specific track of the disk. The servo data is read in a servo mode.

The electronics that are used for these two read modes vary widely from one manufacturer to another since there are no standards as to how these two processes should be implemented. Typically when reading data in both the user mode and the servo mode, an analog signal detected by the read head is first input into a very low-noise pre-amplifier which amplifies the signal. The amplified signal is then input into a read channel circuit. The read channel circuit is typically a single integrated circuit (IC) which directs the amplified signal to either the read path which processes the user data, or the servo path which processes servo data. In either cases the front end of the read channel, consisting of a voltage gain amplifier (VGA) and a continuous-time filter (CTF), is common to both the servo and read signal processing.

The processing circuitry for the user data is self-contained within the read channel IC (mostly analog). However, only part of the servo processing is done within the read channel IC. The majority of the servo processing, such as DSP operations and voice coil motor driving, is performed by separate circuits using one or more ICs. Essential to the servo processing is an A/D converter for digitizing the analog servo signals. In some disk-drive electronics, this A/D converter is part of the read channel IC, and in others it is embedded in a different chip.

Advances in digital signal processing have led to the need to convert most of the analog signal processing in the user data path into a digital signal processing path. Accordingly, A/D converters are utilized in the user data circuit. However, the servo signal processing, despite sharing most of the analog signal pre-processing with the user data path, continues to use a different A/D converter (either internal or external to the read channel IC) because in processing user data, high speed is more important than high resolution. For servo signal processing high resolution is more important than high speed. The additional circuitry needed to process both types of data results in increased cost for such systems. The current invention pertains to merging these two A/D converters into a single reconfigurable A/D converter with minimal increase in size and cost.

SUMMARY OF THE INVENTION

Applicants have developed an advantageous, interpolating reconfigurable A/D converter that handles different input data rates, and which has an output switchable between at least two different levels of resolution. In accordance with the present invention, an A/D converter is disclosed for sampling an input signal, the A/D converter having an output and further comprising reference means for generating a plurality of reference signals; comparing means for comparing the input signal with the reference signals and producing a set of digital signals corresponding to the difference between the input signal and the reference signals; multiplexer means for receiving the set of digital signals and outputting a first subset of the digital signals during a first predetermined time period and for outputting a second subset of the set of digital signals during a second predetermined time period; encoding means for encoding the outputs of the multiplexing means into a first N-bit digital signal during the first predetermined time period and encoding the outputs of the multiplexing means into a second N-bit digital signal during the second predetermined time period; and combining means for combining the first N-bit digital signal and the second N-bit digital signal to form a single N+R bit digital signal and providing the single N+R bit digital signal to the output of the A/D converter.

In a preferred embodiment, the first level of resolution (N) equals six (6) and the increase in resolution (R) equals one (1).

Throughout this application, the term "fast mode" is used to indicate the higher speed/low resolution (N-bit) operating mode and the term "slow mode" is used to indicate the lower speed/high resolution (N+R) operating mode.

In a specific application of the preferred embodiment, the present invention relates to an A/D converter that is capable of being shared both in the user mode and in the servo mode in connection with the control and processing circuitry of disk drives. This increases the amount of shared circuitry between the two processes and decreases the cost in implementing these two processes.

BRIEF DESCRIPTION OF THE DRAWINGS

FIG. 6 is a schematic block diagram of a read channel device using the reconfigurable A/D converter in accordance with the present invention.

DETAILED DESCRIPTION OF THE PREFERRED EMBODIMENT

Figure 1:
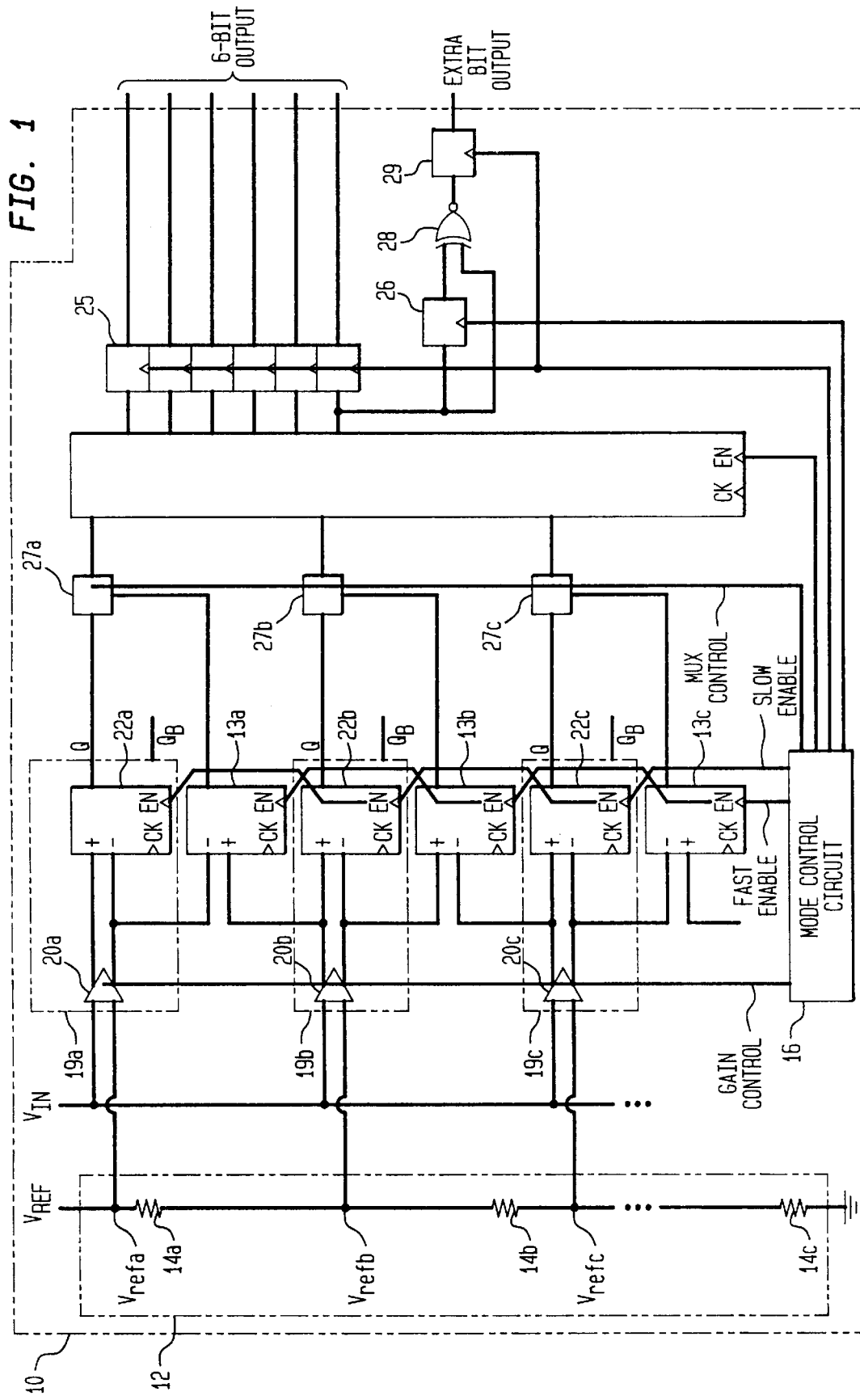
FIG. 1 is a schematic block diagram of a reconfigurable A/D converter in accordance with the present invention.

Referring to FIG. 1, a reconfigurable A/D converter in accordance with the present invention is generally indicated at 10. In the preferred embodiment, the reconfigurable A/D converter has two operating states. In first operating state the A/D converter generates an N-bit digital output signal in response to an analog input signal and in the second operating state the A/D converter 19 generates an (N+R) bit digital output signal in response to a second analog input signal (usually having a different data rate than the first analog signal). "N" indicates the lowest resolution or bit length of the A/D converter's digital output and is usually an integer. "R" indicates the improvement in the number of bits of resolution over "N", which hereinafter is referred to as the "incremental resolution". In a preferred embodiment, N=6 and R=1.

Figure 1A:
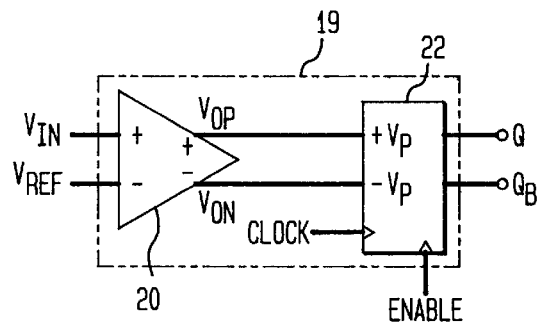
FIG. 1A is a detailed view of one of the comparators of FIG. 1.

A set of reference voltages is generated by a reference circuit means. In a preferred embodiment, the reference circuit means is a resistor ladder 12 comprising a plurality of resistors 14a–14c (preferably a plurality of resistors having the same or substantially similar resistance values). The number of reference voltages needed and, therefore, the number of resistors 14 required in the resistor ladder depends on the lowest resolution, N, of the A/D converter 10. In FIG. 1A, only three resistors 14a, 14b, and 14c are shown for the sake of simplicity. If the lowest resolution is to be six bits (N=6), then sixty-four reference voltages ($2^6$) are needed and sixty three ($2^6 1=63$) resistors are required.

The A/D converter includes $2^N$ comparators referred to generally by reference numeral 19, where N is the resolution as described above. Three comparators 19 (19a, 19b, and 19c) are shown in FIG. 1. A detailed view of one of the comparators 19 is shown in FIG. 1A. To distinguish between the several identical comparators 19, the subcomponents thereof are also designated with like letters (e.g., amplifier 20a is associated with comparator 19a; amplifier 20b is associated with comparator 19b, etc.). Each comparator 19 preferably has one voltage input $V_{in}$, one reference input $V_{ref}$, and two outputs Q and $Q_B$. Each comparator 19 includes a differential amplifier 20 and a latch 22. The outputs of each differential amplifier 20 are input to their associated latch 22 as shown. The value of the reference voltage $V_{ref}$ being input to each comparator 19 will vary dependent upon the number of resistors 14 and the voltage $V_R$ applied to the top of the resistor ladder 12.

The output of adjoining differential amplifiers 20 are also input to a second set of latches 13 (latches 13a, 13b and 13c are shown in FIG. 1), hereafter referred to as the interpolating latches. The interpolating latches 13 are similar to the latches 22 used in the comparator 19. There are generally $2^N$ interpolating latches 13. The use of the output of the differential amplifiers 20 and the interpolating latches 13 effectively forms a new comparator as explained below. A mode control circuit 16 that is responsive to an external command bit/word, is part of the timing and control section of the A/D converter. The command bit/word may be generated by a logic circuit external to the A/D converter, e.g., a microprocessor.

In the illustrated embodiment, each differential amplifier 20 amplifies the voltage difference between its input voltage $V_{in}$ and its reference voltage $V_{ref}$. If the input voltage $V_{in}$ is greater than the reference voltage $V_{ref}$, then the output $V_{OP}$ of the differential amplifier 20 will be more positive than the output $V_{ON}$ of the same differential amplifier and vice versa. The difference between $V_{OP}$ and $V_{ON}$ of the differential amplifier, referred to as the differential output, is proportional to the difference between its two input signals $V_{ref}$ and $V_{in}$ (differential input), and the ratio of the output voltage difference to the input voltage difference is the voltage gain of the differential amplifier. Thus, the larger the input voltage difference, the larger the output voltage difference.

Figure 2:
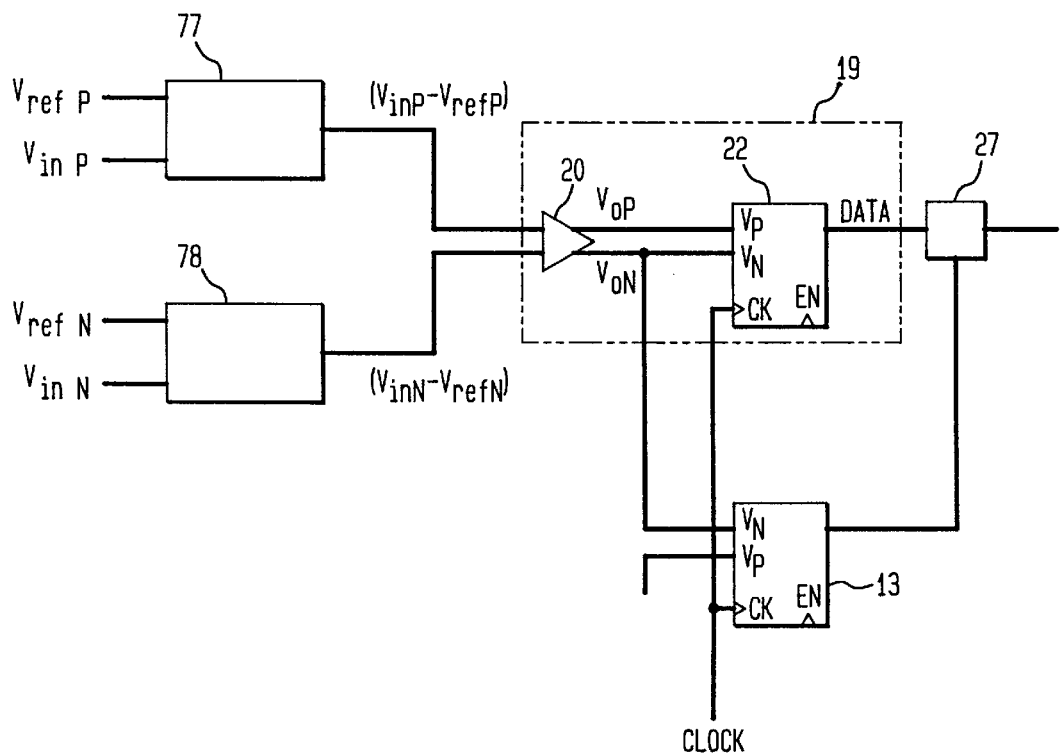
FIG. 2 is a conventional fully differential comparator.

Although the above embodiment describes each comparator 19 as having only two inputs (one input being $V_{in}$ and the other input being the reference voltage, $V_{ref}$), practical implementations may take on several forms. For example, as shown in FIG. 2, a fully differential comparator would have two complementary input voltages $V_{inP}$ and $V_{inN}$, and two complementary reference voltages, $V_{refP}$ and $V_{refN}$. A differencing circuit 77 precedes the comparator 19, and one input to 19 receives $V_{inP}-V_{refP}$ and the other input receives $V_{inN}-V_{refN}$. Differencing circuit 77 may take on many forms. For example, it may be a simple charged capacitor, or a full differential amplifier. The differential comparator circuit shown in FIG. 2 achieves a superior performance when voltage comparisons have to be made in a noisy environment.

Latch 22 preferably includes two signal inputs $V_P$ and $V_N$ and two control inputs (a clock input and an ENABLE input). In the preferred embodiment, the two outputs $V_{OP}$ and $V_{ON}$ of the differential amplifier 20 are connected to the two signal inputs $V_P$ and $V_N$, respectively, of the latch 22 (FIG. 1A). When the latches 22 are enabled (by holding the ENABLE control high), each latch senses the difference between its inputs ($V_P-V_N$) when the clock is high, and when the clock input goes low, this difference is converted into a digital "1" or a digital "0" depending on whether the input difference was positive or negative, respectively. Each latch output holds that state of 1 or 0 until the clock goes high again, at which time the latch enters the sense mode and the sequence of events repeats itself. However, when the ENABLE signal is low, the latches are disabled and hold a steady 1 or 0 output and do not respond to their inputs.

In the slow mode of operation, enable inputs to both sets of latches 13 and 22 are asserted; in the fast mode of operation, the enable inputs to the interpolating latches 13 may be deserted to save power.

During normal operation, ENABLE is held high and an input is applied to the A/D converter. All of the comparators 19 that have their reference voltages smaller than the input voltage $V_{in}$ produce a digital 1 output, and all of the comparators 19 that have their reference voltages higher than the input $V_{in}$ produce a digital 0. These outputs are input to a bank of multiplexers 27 which allow only the outputs of latches 22 to enter the encoder 24 in the fast mode of operation, and which, in the slow mode of operation, alternate between selecting the outputs of latches 22 and latches 13 once each clock cycle. The sequence of zeroes and ones at the output of comparators 19 is referred to as the "thermometer code" because they resemble the appearance of mercury in a thermometer (e.g., 000000111111). The encoder 24 encodes the data output from the latches 13 and 22 and generates a digital output corresponding to the highest comparator activated by $V_{in}$. In the preferred embodiment, encoder 24 is a parallel encoder that has a $2^N$ bit input and an N bit output.

Figure 3:
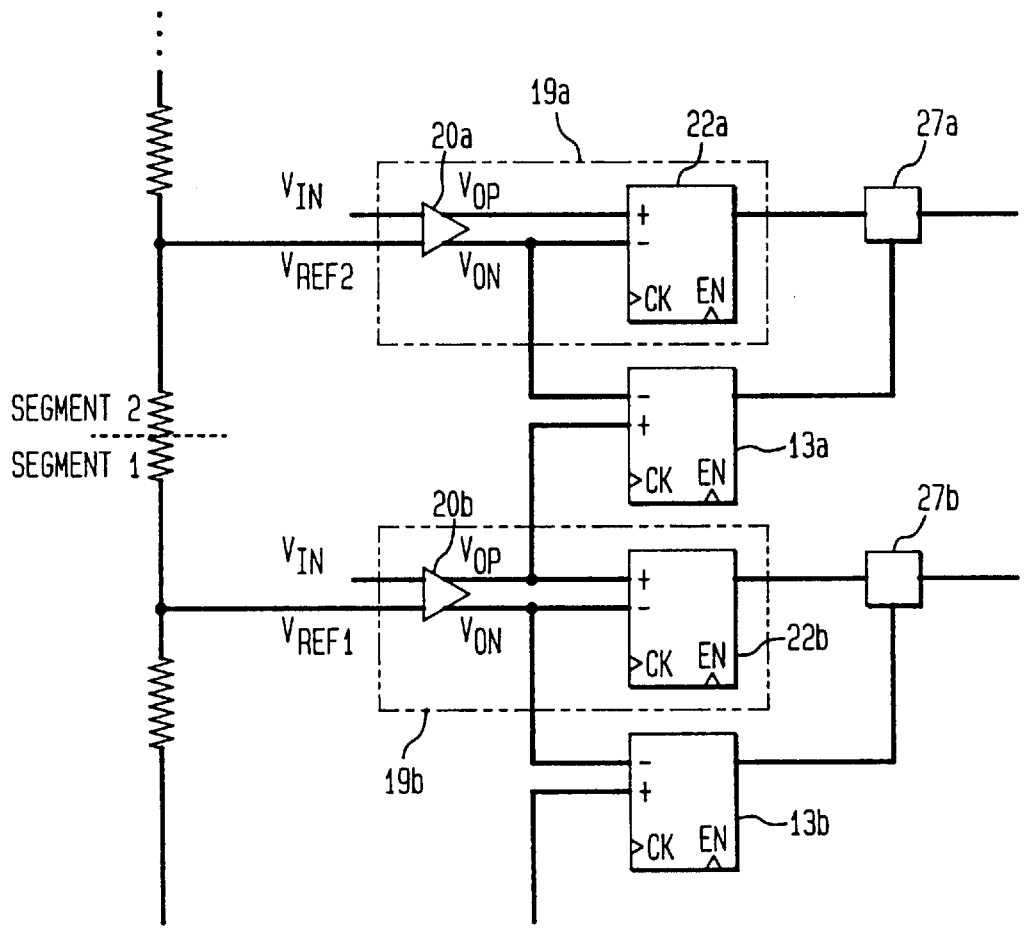
FIG. 3 is a detailed view of a portion of the reconfigurable A/D converter of FIG. 1.

The interpolation operation of the present invention is now described with reference to FIG. 3. FIG. 3 is a detailed view of a portion of FIG. 1 encompassing two adjacent comparators 19 together with their interpolating latches 13. For this example, assume that the analog input $V_{in}$ is in segment II as shown in FIG. 3. The differential input to 20a is ($V_{in}-V_{ref2}$) and the differential input to 20b is ($V_{in}-V_{ref1}$), and since the input is closer to $V_{ref2}$ than it is to $V_{ref1}$, the output $V_{ON}$ of 20a is smaller than the output $V_{OP}$ of 20b. Therefore the interpolating latch 13a will produce a digital "one". On the other hand, if the analog input $V_{in}$ is in segment I, the interpolating latch 13a will output a digital "zero". If the input is exactly at the center between segment I and segment II, the $V_{ON}$ of 20a and $V_{OP}$ of 20b are identical and the latch receives a zero differential signal. The behavior of this combination of adjacent voltages and the interpolating latch forms a virtual comparator that has one input virtually tied to $V_{in}$ and the other input virtually tied to the midpoint between $V_{ref2}$, and $V_{ref1}$. We can show this mathematically as follows:

$$V_{opb} - V_{ona} = A/2[(V_{in} - V_{ref1}) + (V_{in} - V_{ref2})]$$
$$= A/2[2V_{in}(V_{ref2} + V_{ref1})]$$
$$= A[V_{in} - 0.5 * (V_{ref2} + V_{ref1})]$$

where A is the gain of the amplifier.

Thus, the input to the interpolating latch 13a resembles the input it would receive from a differential amplifier with the input connected to $V_{in}$ and the reference voltage connected to a value equal to $0.5*(V_{ref2}+V_{ref1})$ The value $0.5*(V_{ref2}+V_{ref1})$ is the average of the reference voltages ($V_{ref2}+V_{ref1}$) and hence is the same as the voltage at the mid-point of the resistor contained between ($V_{ref2}+V_{ref1}$).

Thus, while the interpolating latches are enabled, the outputs of all interpolating latches 13 form a second thermometer code that will have a break point (a switch-over from a sequence of zeroes to a series of ones) associated with the virtual comparators. If the input was in segment I, both the thermometer codes (due to the real comparators and the virtual comparators) would be identical since the interpolating latch outputs are identical to the real latch outputs. On the other hand, if the input was in segment II, the interpolating latch outputs would have the break point moved by one position as compared with the real latch outputs. This is shown pictorially in FIG. 3A.

For the proper operation of the interpolating method described above, it is important that the outputs of the differential amplifier 20 not saturate when a differential input of less than one half of ($V_{ref2}-V_{ref1}$) is applied to its inputs, where $V_{ref2}$ and $V_{ref1}$ are adjacent resistor tap voltages. The difference, $V_{ref2}-V_{ref1}$ is normally referred to as 1 LSB (least significant bit), although it is really an analog quantity. Saturation is defined as the state wherein the amplifier ceases to respond to its input. Saturation occurs because of the limited output voltage swing capability of the amplifier. Thus, it is necessary to strobe the interpolating latches 19 while the differential amplifier outputs are active and not saturated. Exactly when the latches 19 are strobed is a function of the speed of the A/D converter, and if the A/D converter is running at a low speed, then the potential for the differential amplifiers 19 to saturate is high. Since the time it takes for the differential amplifier 20 to saturate is dependent on both the DC gain and the bandwidth of the amplifier, either or both of these quantities can be altered to prevent saturation in a given amount of time. In the preferred embodiment, this is done by reducing the DC gain of the amplifier. Accordingly, the differential amplifier 20 preferably includes means for adjusting its gain. It should be understood that the bandwidth of the amplifier can also be adjusted either alone or in combination with the DC gain of the amplifier to prevent saturation.

Figures 3A, 4:
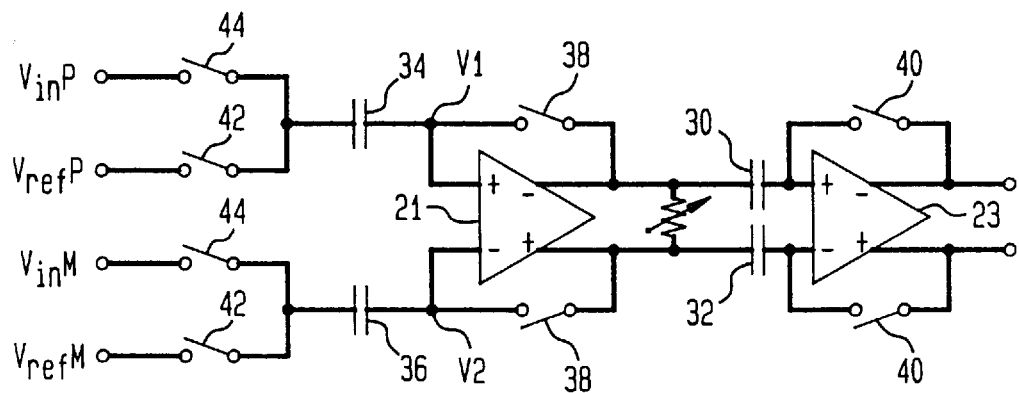
FIG. 3A is a table showing a pictorial representation of the outputs of the interpolating latches shown in FIG. 3.
FIG. 4 is a schematic block diagram of a preferred comparator circuit.

In a preferred embodiment, differential amplifier 20 comprises a pair of capacitively-coupled differential amplifiers 21 and 23 as shown in FIG. 4; this is a conventional fully differential MOS version and has superior performance over the single-ended version shown in FIG. 1.

Assuming that the output of the differential amplifiers 21 and 23 has a high impedance, a programmable resistor 24 is connected across the outputs of differential amplifier 21 and the inputs of differential amplifier 23 as shown in FIG. 4. The programmable resistor is implemented using a MOS operating in the triode region. The gain of the differential amplifier 20 is normally selected so that its output does not saturate in a given amount of time for a 0.5 LSB differential input. The "given amount of time" is determined by the speed of operation of the A/D converter. In the fast mode of operation, mode control circuit 16 turns off the resistor 74 to allow the highest possible gain. In the slow mode of operation, the resistor 74 is programmed to the value needed to present saturation.

The operation of the reconfigurable A/D converter as shown in FIG. 1 will now be described. In the fast mode, when the control bits from mode control circuit 16 configure the A/D converter in its first operating mode, the interpolating latches 13 are disabled by setting the ENABLE signal input to these latches to low. However, the main latches 22 remain enabled. In addition, the proper clocking scheme is chosen for this mode of operation. The $V_{in}$ signal is input to comparators 19 and compared to the reference voltages, $V_{ref}$. In the fast operating mode, multiplexer (mux) 27 receives input from the comparator 19 every clock cycle. The thermometer code from mux 27 is encoded by encoder 24 and an N bit digital representation of $V_{in}$ is output.

When the control bits from mode control circuit 16 configure the A/D converter into its slow mode of operation, interpolating latches 13 are enabled, the gain of the differential amplifier is set, and the proper clocking scheme for this mode is chosen. The A/D converter uses two level encoding during the slow operating mode, 1.e., the mux 27 receives inputs from the comparator 19 and from latch 13, respectively, on alternate clock cycles. For example, during a first clock cycle, a first N-bit word is generated, and during a second clock cycle a second N-bit word is generated; the process is then repeated (see FIG. 5). Since the second N-bit word is either identical to the first N-bit word or is incremented by one, it is only necessary to look at the least significant bit (LSB) of the second N-bit word to determine the final N+1 bit output of the A/D converter. If the LSB bit of second N-bit word is the same as the first N-bit word, then the A/D converter 10 output will be the same as the first N bit word with a zero added to its LSB position to generate the N+1 bits; if they are different, then a 1 is added to the LSB position of the first N-bit word to obtain the N+1 bits.

Figure 5:
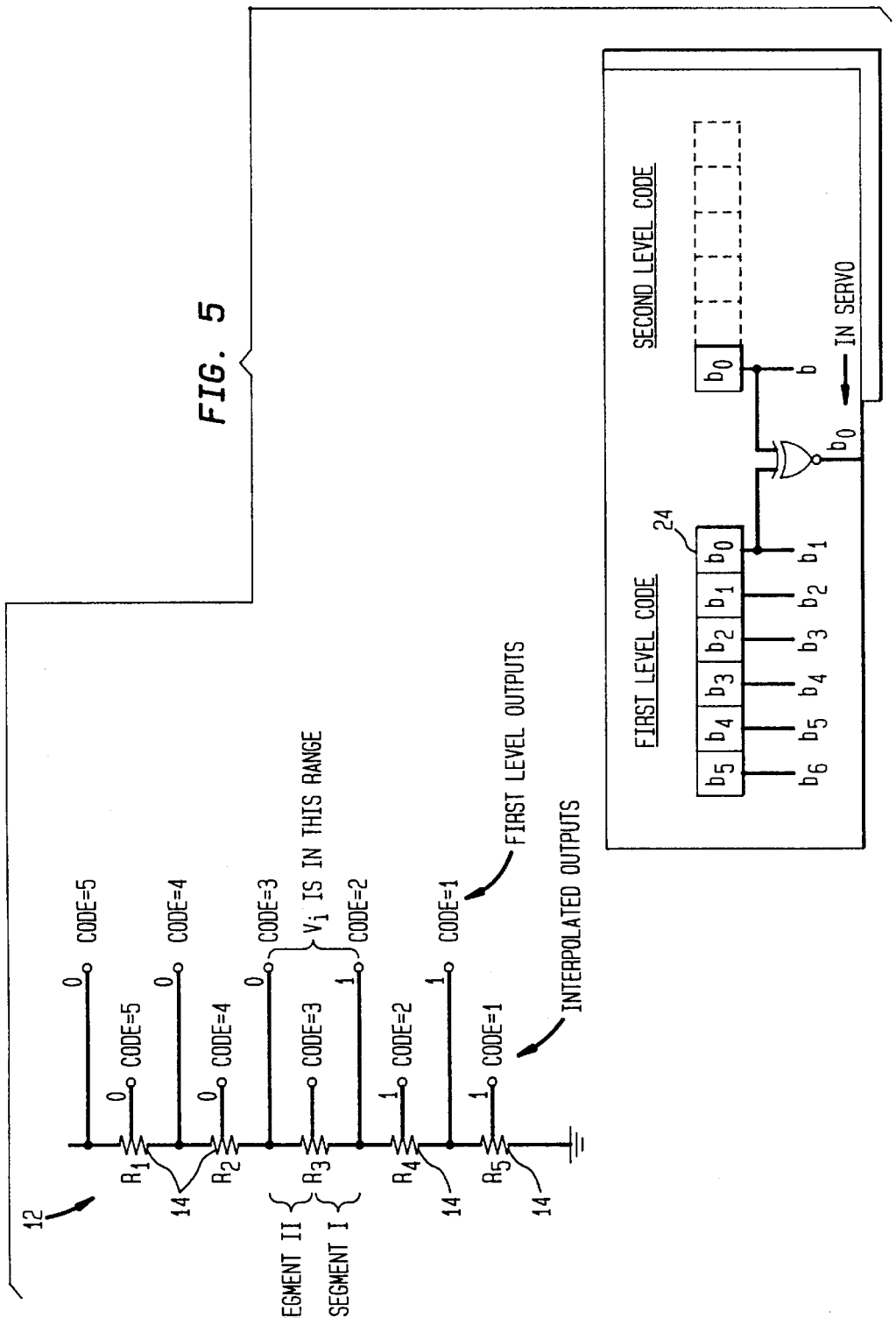
FIG. 5 is a schematic representation of the two-level encoding method.

A symbolic representation of the two-level encoding is shown in FIG. 5. For example, if we assume that $V_{in}$ is in the range between code number 2 and code number 3 of the input ladder (the "example range"), first level encoding gives a six bit word that is equal to "000011" (output code equals 3) indicating that the input is in the example range. The second six bit word will be either "000011" indicating that the input is in SEGMENT I of the example (in which case the 7-bit word would be 0000110) or "000100" indicating that the input is in SEGMENT II of the example range (in which case the 7-bit word would be 0000111). Thus, the seventh bit is simply the EXCLUSIVE OR of the LSB bit of the two 6-bit words.

Although in the description above, the first level encoding corresponds to real comparator outputs and the second level encoding corresponds to the interpolating latches output, additional hardware is required to implement the algorithm, since the results of the first level encoding would have to be stored separately. To avoid this, in the preferred embodiment, the sequence of encoding is reversed. First, the interpolating latch outputs are encoded and the resulting 6-bits are clocked into the output latches 25 (a series of flip-flop, for example) that are shown in FIG. 1. In addition, the LSB bit of the same 6-bit word is also held separately in a separate flip-flop 26. During the second pass, the comparator outputs 19 are encoded to form the second 6-bit word. These bits also are latched into the output latches 25 of the encoder, thus over-writing the results of the first level encoding. These bits also represent the first six bits of the final 7-bit word. The seventh bit is generated by exclusive ORing the stored bit from first level encoding with the LSB bit of the second level encoding via XOR gate 28 and flip-flop 29, just as shown in FIG. 5, with the exception that the two passes are done in the reverse order.

It should be noted that the reconfigurable A/D converter may be modified to provide more than two operating states (i.e., more than two level encoding). For example a three-state A/D converter that generates three N-bit words, one in each of its three states, is possible with the addition of a second set of differential amplifiers and interpolating latches.

The reconfigurable A/D converter 10 in accordance with the present invention is ideally suited for use in a read channel circuit. The first operating mode of the A/D converter 10 is used during the user data mode and the second operating mode is used during the servo mode. Referring to FIG. 6, a schematic block diagram of a read channel device utilizing the reconfigurable flash A/D converter of the present convention is shown. The read channel device is indicated generally at 100. A first motor (not shown) spins the magnetic disks 114. A second motor (not shown) moves the read heads 116 in a radial direction with respect to the disks 114. The signal path used to demodulate the user data signal consists of a Low Noise Preamp (LNP) 109, a Variable Gain Amplifier (VGA) 102, a low-pass filter 104, an equalizer 111, a reconfigurable A/D converter 10, and a sequence detector 112.

The signal path used to demodulate the servo data signal is the same as the path for the user data, up to the A/D converter 10. Instead of travelling through the sequence detector 112, however, the output of the A/D converter is sent to a digital servo demodulator 117 as shown.

A command word indicates whether the signal to be detected by the read head is a user data signal or a servo signal (i.e., whether the read channel circuit is in the user data mode or the servo data mode). In this manner, the channel processor circuit is constantly updating positioning information by switching between the servo mode and read data mode. In a particular read channel device, the access and transfer rate is approximately 250 MHz in the user data mode and is approximately 80 MHz in the servo mode. Furthermore, the resolution of the A/D converter during the user data mode is six (6) bits while in the servo mode it is seven (7) bits. Despite the differences in the data rate and resolution of the output word, the reconfigurable A/D converter can be used during both modes of operation.

During the servo mode, the second level encoding within the A/D converter is similar to that of the read mode encoding. That is, after the servo data is read, the A/D converter 10 generates an N-bit word in a similar fashion as generated during the read mode. However, since the data transfer rate is slower during the servo mode, the A/D convertor 10 performs the second level encoding in the same time slot to generate the extra LSB forming an N+1 bit word.

Regarding the A/D converter 10, the servo mode can be described as an enhanced read mode. This means that all of the things that happen in the read mode also happen in the servo mode, and in addition, the interpolating latches 13 are powered up and the A/D clocking is internally modified to facilitate the operation of the interpolating latches 13 and the two level encoding.

In a preferred embodiment, the resolution of the A/D converter in the user data mode is N=6 bits and in the servo data mode is N+1=7 bits. An interpolating latch 13 is connected between the outputs of each of the sixty-four comparators. In prior art A/D converters, an additional sixty-four comparators would be needed, for a total of one hundred twenty-eight, to produce the extra bit of resolution (i.e., $2^7=128$).

During the servo mode in the preferred embodiment, when the command signal switches from the user data mode to the servo mode, the interpolating latches 13 are enabled and the length of the thermometer code now will be 128, and these will be encoded by a single 64 input/6 output encoder as follows. First, the encoder encodes the 64 thermometer bits as it normally does in the user mode and the resulting 6 bits are then latched in a 6-bit register. Next, the two-input multiplexer 27 present at the input of the encoder 24 switches to connect the outputs of the interpolating latches 13 to the encoder 24 and a second 6-bit word is thus generated. The final 7-bit word is generated from these two 6-bit words as explained above. In order to achieve this sequential two-pass encoding, the encoder 24 must be run at no higher than half the speed of the user mode. Since in the preferred embodiment, the A/D converter operates at 250 MHz in the user mode, the speed of the encoder presents no concern for the servo mode of operation up to 125 MHz. Since, typically, the servo mode speed is 80 MHz, the encoder 24 can make two passes in the same time slot that is allocated for encoding the thermometer code. This is, the same six-bit encoder is reused during a particular time slot.

The use of the present invention simplifies the user and servo data processing and is less expensive to manufacture and to deploy than two separate A/D converters having different resolutions as is currently being used.

While there has been described herein the principals of the invention, it is to be understood by those skilled in the art that this description is made only by way of example and not as a limitation to the scope of the invention. Accordingly, it is intended by the appending claims, to cover all modifications of the invention which fall within the true spirit and scope of the invention.

We claim:

1. An integrated circuit having an A/D converter for sampling an input signal, said A/D converter having an output and further comprising:

reference means for generating a plurality of reference signals;

comparing means for comparing said input signal with said reference signals and producing a set of digital signals corresponding to the difference between said input signal and said reference signals;

multiplexer means for receiving said set of digital signals and outputting a first subset of said digital signals during a first predetermined time period and for outputting a second subset of said set of digital signals during a second predetermined time period;

encoding means for encoding the outputs of the multiplexing means into a first N-bit digital signal during said first predetermined time period and encoding the outputs of the multiplexing means into a second N-bit digital signal during said second predetermined time period; and combining means for combining said first N-bit digital signal and said second N-bit digital signal to form a single N+1 bit digital signal and providing said single N+1 bit digital signal to the output of the A/D converter.

2. An A/D converter as set forth in claim 1 wherein said A/D converter is reconfigurable between a first mode in which the output of the A/D converter is an N-bit output and a second mode in which the output of the A/D converter is an N+1 bit output.

3. An A/D converter as set forth in claim 1 wherein said combining means is switchable between a first state in which said first N-bit digital output is provided to the output of said A/D converter and a second state in which said single N+1 bit digital signal is provided to the output of said A/D converter.

4. An A/D converter as set forth in claim 1, wherein said combining means comprises:

first temporary storage means, coupled to said encoding means, for temporarily storing the second N-bit signals encoded by said encoding means;

second temporary storage means, coupled to said encoding means, for temporarily storing the LSB of said first N-bit signal; and determining means, coupled to said encoding means and said second temporary storage means, for determining if the LSB of said second N-bit signal is the same as or different from the LSB stored by said second temporary storage means.

5. An A/D converter as set forth in claim 4, wherein said first temporary storage means comprises a plurality of flip-flops.

6. An A/D converter as set forth in claim 5, wherein said second temporary storage means comprises a flip-flop.

7. An A/D converter as set forth in claim 6, wherein said determining means comprises an EXCLUSIVE-OR gate.

8. In a magnetic data storage device having data recorded in tracks on a media surface, a read channel apparatus comprising:

a transducer for reading both information data and position data from the tracks and for generating an input signal having a voltage corresponding to either the information data or the position data; and an A/D converter comprising:

control means for generating a command signal to control the position of said transducer for selecting the reading of either the information data or position data from said tracks;

reference means for generating a plurality of reference signals;

comparing means for comparing said input signal with said reference signals and producing a set of digital signals corresponding to the difference between said input signal and said reference signals;

multiplexer means for receiving said set of digital signals and outputting a first subset of said digital signals during a first predetermined time period and for outputting a second subset of said set of digital signals during a second predetermined time period;

encoding means for encoding the outputs of the multiplexing means into a first N-bit digital signal during said first predetermined time period and encoding the outputs of the multiplexing means into a second N-bit digital signal during said second predetermined time period; and combining means for combining said first N-bit digital signal and said second N-bit digital signal to form a single N+1 bit digital signal and providing said single N+1 bit digital signal to the output of the A/D converter, said read channel apparatus reading said position data when said single N+1 bit digital signal is output from said A/D converter.

9. A read channel apparatus as set forth in claim 8, wherein said A/D converter is reconfigurable between a first mode in which the output of the A/D converter is an N-bit output and a second mode in which the output of the A/D converter is an N+1 bit output.

10. A read channel apparatus as set forth in claim 8, wherein said combining means is switchable between a first state in which said first N-bit digital output is provided to the output of said A/D converter and a second state in which said single N+1 bit digital signal is provided to the output of said A/D converter.

11. A read channel apparatus as set forth in claim 8, wherein said combining means comprises:

first temporary storage means, coupled to said encoding means, for temporarily storing the second N-bit signals encoded by said encoding means;

second temporary storage means, coupled to said encoding means, for temporarily storing the LSB of said first N-bit signal; and determining means, coupled to said encoding means and said second temporary storage means, for determining if the LSB of said second N-bit signal is the same as or different from the LSB stored by said second temporary storage means.

12. A read channel apparatus as set forth in claim 11, wherein said first temporary storage means comprises a plurality of flip-flops.

13. A read channel apparatus as set forth in claim 12, wherein said second temporary storage means comprises a flip-flop.

14. A read channel apparatus as set forth in claim 13, wherein said determining means comprises an EXCLUSIVE-OR gate.

15. A method for converting an analog signal into a digital signal using an analog-to-digital (A/D) converter having a reconfiguration circuit configurable between a first operating state and a second operating state, said method comprising the steps of:

a) receiving an analog signal;

b) generating a set of reference signals;

c) comparing analog signal with said reference signals;

d) forming a set of digital signals corresponding to the difference between said analog signal and said reference signals;

e) forming and outputting a first subset of said set of digital signals during a first predetermined time period;

f) forming and outputting a second subset of said set of digital signals during a second predetermined time period;

g) encoding said first subset into a first N-bit digital signal during said first predetermined time period;

h) encoding said second subset into a second N-bit digital signal during said second predetermined time period; and i) combining said first N-bit digital signal and said second N-bit digital signal to form a single N+1 bit digital signal and providing said single N+1 bit digital signal to the output of the A/D converter.

16. An A/D converter for sampling an input signal, said A/D converter having an output and further comprising:

reference means for generating a plurality of reference signals;

comparing means for comparing said input signal with said reference signals and producing a set of digital signals corresponding to the difference between said input signal and said reference signals;

multiplexer means for receiving said set of digital signals and outputting a first subset of said digital signals during a first predetermined time period and for outputting a second subset of said set of digital signals during a second predetermined time period;

encoding means for encoding the outputs of the multiplexing means into a first N-bit digital signal during said first predetermined time period and encoding the outputs of the multiplexing means into a second N-bit digital signal during said second predetermined time period; and combining means for combining said first N-bit digital signal and said second N-bit digital signal to form a single N+R bit digital signal and providing said single N+R bit digital signal to the output of the A/D converter.

17. An integrated circuit having an A/D converter for sampling an input signal, said A/D converter having an output and further comprising:

a reference signal source that generates a plurality of reference signals;

a comparator that compares said input signal with said reference signals and produces a set of digital signals corresponding to the difference between said input signal and said reference signals;

a multiplexer that receives said set of digital signals and outputs a first subset of said digital signals during a first predetermined time period and outputs a second subset of said set of digital signals during a second predetermined time period;

an encoder that encodes the outputs of the multiplexer into a first N-bit digital signal during said first predetermined time period and encodes the outputs of the multiplexer into a second N-bit digital signal during said second predetermined time period; and a combiner that combines said first N-bit digital signal and said second N-bit digital signal to form a single N+1 bit digital signal and provides said single N+1 bit digital signal to the output of the A/D converter.

18. An A/D converter as set forth in claim 17 wherein said A/D converter is reconfigurable between a first mode in which the output of the A/D converter is an N-bit output and a second mode in which the output of the A/D converter is an N+1 bit output.

19. An A/D converter as set forth in claim 17 wherein said combiner is switchable between a first state in which said first N-bit digital output is provided to the output of said A/D converter and a second state in which said single N+1 bit digital signal is provided to the output of said A/D converter.

20. An A/D converter as set forth in claim 17, wherein said combiner comprises:

a first memory, coupled to said encoder, that temporarily stores the second N-bit signals encoded by said encoder;

a second memory, coupled to said encoder, that temporarily stores the LSB of said first N-bit signal; and a decision device, coupled to said encoder and said second memory, that decides if the LSB of said second N-bit signal is the same as or different from the LSB stored by said second memory.

21. An A/D converter as set forth in claim 20, wherein said first memory comprises a plurality of flip-flops.

22. An A/D converter as set forth in claim 21, wherein said second memory comprises a flip-flop.

23. An A/D converter as set forth in claim 22, wherein said decision device comprises an EXCLUSIVE-OR gate.

24. In a magnetic data storage device having data recorded in tracks on a media surface, a read channel apparatus comprising:

a transducer for reading both information data and position data from the tracks and for generating an input signal having a voltage corresponding to either the information data or the position data; and an A/D converter comprising:

a controller that generates a command signal to control the position of said transducer for selecting the reading of either the information data or position data from said tracks;

a reference signal source that generates a plurality of reference signals;

a comparator that compares said input signal with said reference signals and producing a set of digital signals corresponding to the difference between said input signal and said reference signals;

a multiplexer that receives said set of digital signals and outputs a first subset of said digital signals during a first predetermined time period and outputs a second subset of said set of digital signals during a second predetermined time period;

an encoder that encodes the outputs of the multiplexer into a first N-bit digital signal during said first predetermined time period and encodes the outputs of the multiplexer into a second N-bit digital signal during said second predetermined time period; and a combiner that combines said first N-bit digital signal and said second N-bit digital signal to form a single N+1 bit digital signal and provides said single N+1 bit digital signal to the output of the A/D converter, said read channel apparatus reading said position data when said single N+1 bit digital signal is output from said A/D converter.

25. A read channel apparatus as set forth in claim 24, wherein said A/D converter is reconfigurable between a first mode in which the output of the A/D converter is an N-bit output and a second mode in which the output of the A/D converter is an N+1 bit output.

26. A read channel apparatus as set forth in claim 24, wherein said combiner is switchable between a first state in which said first N-bit digital output is provided to the output of said A/D converter and a second state in which said single N+1 bit digital signal is provided to the output of said A/D converter.

27. A read channel apparatus as set forth in claim 24, wherein said combiner comprises:

a first memory, coupled to said encoder, that temporarily stores the second N-bit signals encoded by said encoder means;

a second memory, coupled to said encoder, that temporarily stores the LSB of said first N-bit signal; and a decision device, coupled to said encoder and said second memory, that determines if the LSB of said second N-bit signal is the same as or different from the LSB stored by said second memory.

28. A read channel apparatus as set forth in claim 24, wherein said first memory comprises a plurality of flip-flops.

29. A read channel apparatus as set forth in claim 28, wherein said second memory comprises a flip-flop.

30. A read channel apparatus as set forth in claim 29, wherein said decision device comprises an EXCLUSIVE-OR gate.

31. An integrated circuit having an A/D converter for sampling an input signal, said A/D converter having an output and further comprising:

a reference signal source that generates a plurality of reference signals;

a comparator that compares said input signal with said reference signals and produces a set of digital signals corresponding to the difference between said input signal and said reference signals;

a multiplexer that receives said set of digital signals and outputes a first subset of said digital signals during a first predetermined time period and outputs a second subset of said set of digital signals during a second predetermined time period;

an encoder that encodes the outputs of said multiplexer into a first N-bit digital signal during said first predetermined time period and encodes the outputs of said multiplexer into a second N-bit digital signal during said second predetermined time period; and a combiner that combines said first N-bit digital signal and said second N-bit digital signal to form a single N+R bit digital signal and provides said single N+R bit digital signal to the output of the A/D converter.

* * * * *